United States Patent
Matsumoto et al.

(10) Patent No.: US 10,338,102 B2
(45) Date of Patent: Jul. 2, 2019

(54) VOLTAGE DETECTION DEVICE FOR TRANSFORMING APPARATUS

(75) Inventors: Daigo Matsumoto, Chiyoda-ku (JP); Shigeo Fujii, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 899 days.

(21) Appl. No.: 14/398,255

(22) PCT Filed: Jun. 1, 2012

(86) PCT No.: PCT/JP2012/064280
§ 371 (c)(1),
(2), (4) Date: Oct. 31, 2014

(87) PCT Pub. No.: WO2013/179479
PCT Pub. Date: Dec. 5, 2013

(65) Prior Publication Data
US 2015/0112621 A1 Apr. 23, 2015

(51) Int. Cl.
*G01R 1/30* (2006.01)
*G01R 15/06* (2006.01)
(Continued)

(52) U.S. Cl.
CPC ............ *G01R 1/30* (2013.01); *G01R 1/20* (2013.01); *G01R 15/06* (2013.01); *G01R 19/0084* (2013.01); *G01R 31/3274* (2013.01)

(58) Field of Classification Search
CPC .......... H03H 11/126; G01R 1/30; G01R 1/20; G01R 15/06; G01R 19/0084; G01R 31/3274
See application file for complete search history.

(56) References Cited

U.S. PATENT DOCUMENTS 5,432,438 A * 7/1995 Baumgartner ....... G01R 15/142
324/127
6,271,720 B1 * 8/2001 Sevastopoulos ....... H03H 11/04
327/552
(Continued)

FOREIGN PATENT DOCUMENTS

JP 4-326294 A 11/1992
JP 5-251251 A 9/1993
(Continued)

OTHER PUBLICATIONS

Lesurf, Combining low-pass and high pass filters, AudioMisc, Jun. 6, 2005.*
(Continued)

*Primary Examiner* — Kyle R Quigley
(74) *Attorney, Agent, or Firm* — Buchanan Ingersoll & Rooney PC

(57) ABSTRACT

In a voltage detection device for a transforming apparatus, a voltage divider is constituted by providing an intermediate electrode between a central conductor and a tank of the transforming apparatus, to detect a voltage E1 of the central conductor based on a voltage E2 of the voltage divider. The voltage detection device for a transforming apparatus includes an incomplete integration circuit having a reverse characteristic to an input/output voltage amplitude ratio-frequency characteristic of a high-pass filter formed by a floating electrostatic capacitance between the central conductor and the intermediate electrode, an earth electrostatic capacitance between the intermediate electrode and the tank, and a voltage dividing resistor connected in parallel to the earth electrostatic capacitance, and a signal processing circuit that outputs a value based on an output voltage E3 of the incomplete integration circuit as the voltage E1 of the central conductor.

7 Claims, 5 Drawing Sheets

(51) Int. Cl.
*G01R 31/327* (2006.01)
*G01R 1/20* (2006.01)
*G01R 19/00* (2006.01)

(56) References Cited

U.S. PATENT DOCUMENTS

2004/0201373 A1    10/2004  Kato
2006/0145754 A1*    7/2006  Kitano ................. H03H 7/0153
                                                                  327/552

FOREIGN PATENT DOCUMENTS

| JP | 2001-066329 A | 3/2001 |
| JP | 2002-271924 A | 9/2002 |
| JP | 2002-311061 A | 10/2002 |
| JP | 2004-117310 A | 4/2004 |
| JP | 2004-257905 A | 9/2004 |
| JP | 2004-347397 A | 12/2004 |
| JP | 2006-337358 A | 12/2006 |

OTHER PUBLICATIONS

International Search Report (PCT/ISA/210) dated Jul. 3, 2012, by the Japanese Patent Office as the International Searching Authority for International Application No. PCT/JP2012/064280.
Written Opinion (PCT/ISA/237) dated Jul. 3, 2012, by the Japanese Patent Office as the International Searching Authority for International Application No. PCT/JP2012/064280.
Mitsubishi Electric Technical Report, A New Style CT/PD, Aug. 2001, pp. 31-36, vol. 75, No. 8.

* cited by examiner

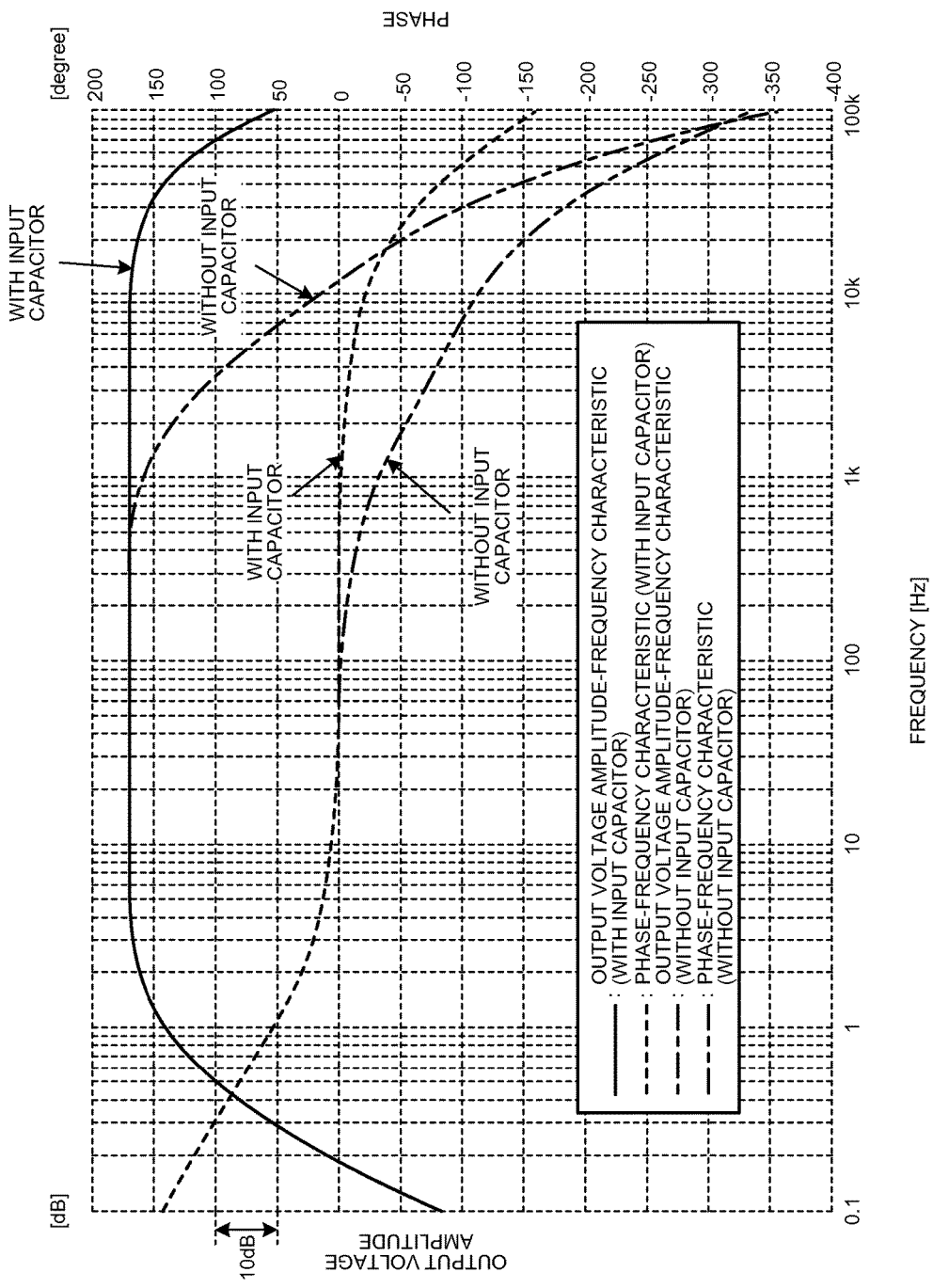

VOLTAGE DETECTION DEVICE FOR TRANSFORMING APPARATUS

FIELD

The present invention relates to a voltage detection device for a transforming apparatus in which a voltage divider is constituted by providing an intermediate electrode between a central conductor of the transforming apparatus such as a gas insulated switchgear (GIS) and a tank, so as to measure a voltage of the central conductor on the basis of a voltage of the voltage divider.

BACKGROUND

Conventionally, in a transforming apparatus such as the GIS, an intermediate electrode is provided between a central conductor and a tank to constitute a voltage divider, and the voltage of the central conductor is detected based on the voltage of the voltage divider. In such a voltage detection device for a transforming apparatus, a high-pass filter is formed by a floating electrostatic capacitance between the central conductor and the intermediate electrode, an earth electrostatic capacitance between the intermediate electrode and the tank, and a secondary resistor connected in parallel to the earth electrostatic capacitance. An output waveform of the voltage divider becomes a time derivative waveform of a voltage waveform of the central conductor. Therefore, a voltage signal proportional to temporal differentiation of a primary voltage generated in a main conductor is acquired from an output terminal, and integration treatment is performed with respect to the acquired voltage signal to acquire a voltage signal proportional to the primary voltage. The acquired voltage signal is analog-digital converted to acquire digital data proportional to the primary voltage (for example, Patent Literature 1).

CITATION LIST

Patent Literature

Patent Literature 1: Japanese Patent Application Laid-open No. 2004-347397

SUMMARY

Technical Problem

When the voltage of the central conductor of the transforming apparatus is to be detected by using the conventional technique described above, the secondary resistor needs to be provided to decrease the voltage value of the intermediate electrode to a level capable of being input to a voltage detector, because the voltage value of the intermediate electrode constituting the voltage divider generally reaches several kilovolts (kV). Furthermore, in order to suppress an abnormal voltage due to a surge generated in the central conductor, a surge protection capacitor is generally mounted in parallel to the secondary resistor described above.

However, when the conventional technique described above is used, there is a problem that the earth electrostatic capacitance increases due to addition of the surge protection capacitor to decrease a cutoff frequency of the high-pass filter, and a high-frequency component transitionally generated at the time of a system trouble or the like attenuates by the integration treatment in the subsequent stage, thereby making it difficult to accurately measure a response of the voltage waveform of the central conductor.

The present invention has been achieved in view of the above problems, and an object of the present invention is to provide a voltage detection device for a transforming apparatus that can accurately measure a response of a voltage waveform of a central conductor by accurately detecting a high-frequency component transitionally generated at the time of a system trouble or the like.

Solution to Problem

In order to solve the aforementioned problems, a voltage detection device for a transforming apparatus in which a voltage divider is constituted by providing an intermediate electrode between a central conductor of the transforming apparatus and a tank, to detect a voltage of the central conductor based on a voltage of the voltage divider according to one aspect of the present invention includes: an incomplete integration circuit having a reverse characteristic to an input/output voltage amplitude ratio-frequency characteristic of a high-pass filter formed by a floating electrostatic capacitance between the central conductor and the intermediate electrode, an earth electrostatic capacitance between the intermediate electrode and the tank, and a voltage dividing resistor connected in parallel to the earth electrostatic capacitance; and a signal processing circuit that outputs a value based on an output voltage of the incomplete integration circuit as the voltage of the central conductor.

Advantageous Effects of Invention

According to the present invention, a response of a voltage waveform of a central conductor can be accurately measured by accurately detecting a high-frequency component transitionally generated at the time of a system trouble or the like.

BRIEF DESCRIPTION OF DRAWINGS

FIG. 5 shows an example of an output characteristic of an incomplete integration circuit in the voltage detection device for a transforming apparatus according to the present embodiment.

DESCRIPTION OF EMBODIMENTS

Exemplary embodiments of a voltage detection device for a transforming apparatus according to the present invention will be explained below in detail with reference to the accompanying drawings. The present invention is not limited to the embodiments.

Embodiment

Figure 1:
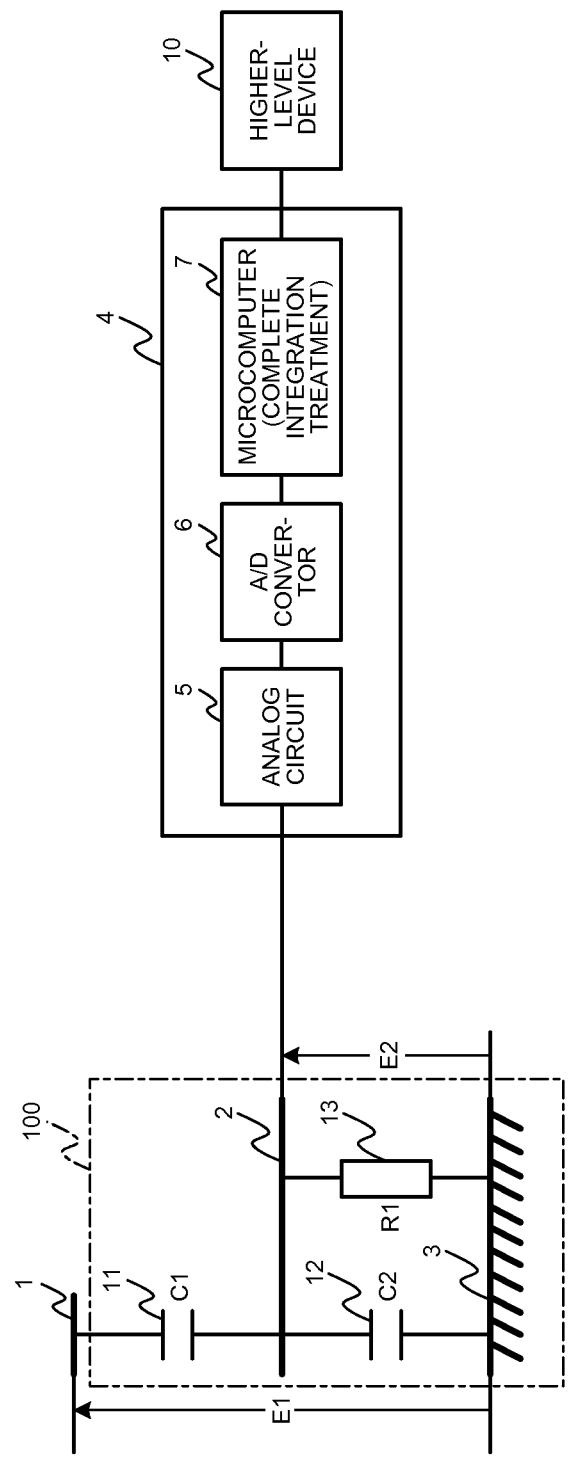
FIG. 1 shows a configuration example of a conventional voltage detection device for a transforming apparatus.

FIG. 1 shows a configuration example of a conventional voltage detection device for a transforming apparatus. In the example shown in FIG. 1, an intermediate electrode 2 is provided between a central conductor 1 of the GIS and a tank 3 to constitute a voltage divider, and a voltage of the central conductor 1 (hereinafter, "central conductor voltage") E1 is detected based on a voltage of the voltage divider (hereinafter, "voltage-divider voltage") E2.

A high-pass filter 100 is formed by a floating electrostatic capacitance 11 between the central conductor 1 and the intermediate electrode 2, an earth electrostatic capacitance 12 between the intermediate electrode 2 and the tank 3, and a voltage dividing resistor 13 connected in parallel to the earth electrostatic capacitance 12.

The voltage-divider voltage E2 is taken into an analog circuit 5, and is converted to digital data by an A/D convertor 6. Complete integration treatment is performed by a digital process in a microcomputer 7, so as to convert the digital data to data proportional to the central conductor voltage E1, and the data is transmitted to a higher-level device 10. A signal processing circuit 4 is configured to include the analog circuit 5, the A/D convertor 6, and the microcomputer 7.

Figure 2:
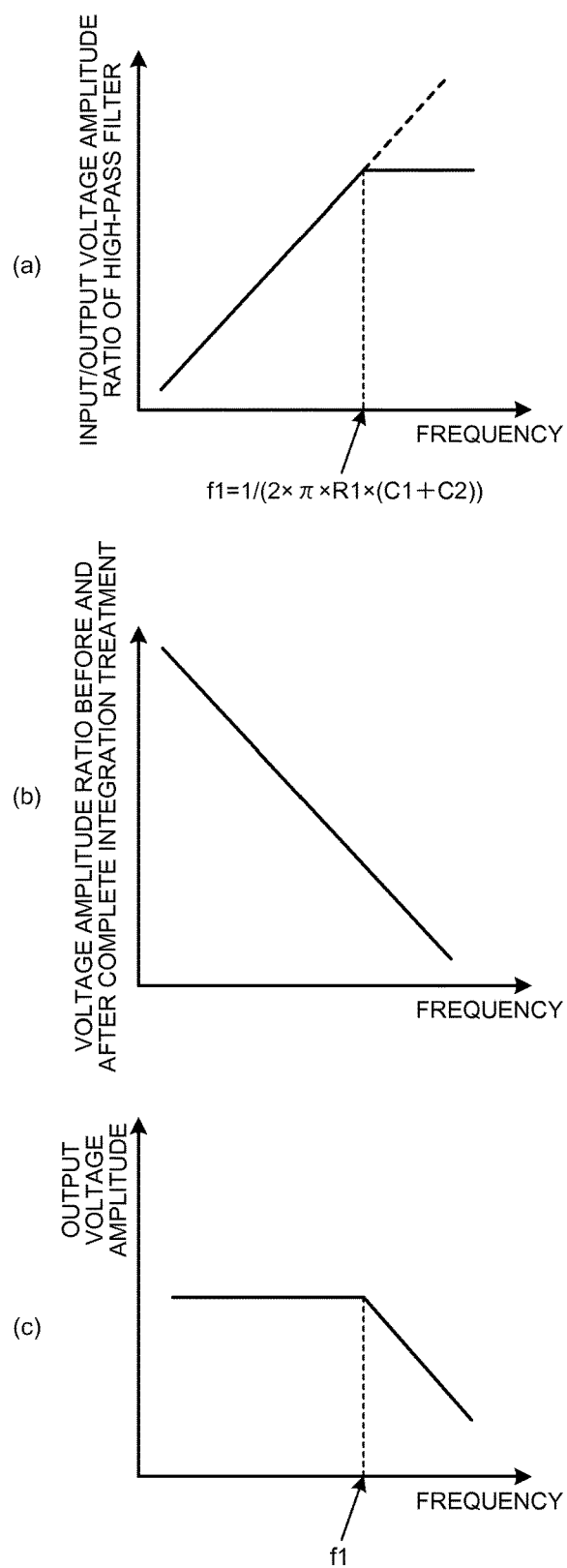
FIG. 2 show characteristic examples of respective units in the conventional example shown in FIG. 1.

FIG. 2 show characteristic examples of respective units in the conventional example shown in FIG. 1. In FIG. 2(a), a logarithm of frequency is plotted on a horizontal axis, and an input/output voltage amplitude ratio of the high-pass filter 100 is plotted on a vertical axis. In FIG. 2(b), the logarithm of frequency is plotted on the horizontal axis, and a voltage amplitude ratio before and after performing the complete integration treatment is plotted on the vertical axis. In FIG. 2(c), the logarithm of frequency is plotted on the horizontal axis, and output voltage amplitude of the signal processing circuit 4 is plotted on the vertical axis.

When it is assumed that a capacitance value of the floating electrostatic capacitance 11 is C1, and a capacitance value of the earth electrostatic capacitance 12 is C2, generally a ratio of approximately C1:C2=1:10 is obtained. When it is assumed that the voltage dividing resistor 13 is not provided, the voltage-divider voltage E2 is expressed by the following equation (1).

$$E2=(C1/(C1+C2))\times E1 \qquad (1)$$

In the above equation (1), for example, when C1=1 [pF], C2=10 [pF], and E1=132/√3 [kVrms] are assumed, E2=(1/11)×(132/√3)≈7 [kVrms] is obtained. A voltage value that can be handled by a general electronic circuit is about several V to ten-odd V. Therefore, in order to set the voltage-divider voltage E2 to a voltage value that can be handled by the general electronic circuit, a voltage division ratio needs to be adjusted by connecting the voltage dividing resistor 13 in parallel to the earth electrostatic capacitance 12.

When the voltage dividing resistor 13 is provided, as described above, the high-pass filter 100 is formed by the floating earth electrostatic capacitance 11, the earth electrostatic capacitance 12, and the voltage dividing resistor 13. At this time, the voltage-divider voltage E2 is expressed by the following equation (2) (where ω=2×π×f), and a cutoff frequency f1 of the high-pass filter 100 is expressed by the following equation (3).

$$|E2|=\omega \times C1 \times R1/\sqrt{(1+(\omega \times (C1+C2)\times R1)^2)}\times |E1| \qquad (2)$$

$$f1=1/(2\times \pi \times R1\times (C1+C2)) \qquad (3)$$

Accordingly, an input/output voltage amplitude ratio-frequency characteristic of the high-pass filter 100 becomes such that, as shown in FIG. 2(a), a high frequency band equal to or higher than the cutoff frequency f1 becomes a pass band, and at the cutoff frequency f1 or below, the input/output voltage amplitude ratio monotonously increases with respect to an increase of the logarithm of frequency. On the other hand, a voltage amplitude ratio-frequency characteristic before and after performing the complete integration treatment becomes such that, as shown in FIG. 2(b), the input/output voltage amplitude ratio monotonously decreases with respect to an increase of the logarithm of frequency (note that, in the frequency band higher than "sampling frequency÷2", local minimum and local maximum are repeated). Therefore, an output voltage amplitude-frequency characteristic of the signal processing circuit 4, which is subjected to the complete integration treatment in the microcomputer 7 and is output, becomes such that, as shown in FIG. 2(c), the high frequency band equal to or higher than the cutoff frequency f1 of the high-pass filter 100 attenuates.

For example, a resistance value R1 of the voltage dividing resistor 13 for setting the rated frequency of the central conductor voltage E1 to 50 [Hz], and setting the voltage-divider voltage E2 at the rated frequency (in this case, 50 [Hz]) to about 1 [Vrms] becomes about 42 [kΩ] according to the above equation (2). At this time, the cutoff frequency f1 of the high-pass filter 100 becomes about 345 [kHz] according to the above equation (3). A high-frequency component transitionally generated at the time of a system trouble or the like is about several [kHz] to 10 [kHz]. Therefore, in this case, the high-frequency component transitionally generated at the time of a system trouble or the like can be accurately detected without being affected by the cutoff frequency f1 of the high-pass filter 100.

Meanwhile, when a switching device (not shown) such as a disconnecting switch in the GIS is operated, a surge having a frequency component of about several [MHz] to 100 [MHz] is generated. A surge protection capacitor (not shown) is generally mounted thereon in parallel to the voltage dividing resistor 13 to suppress an abnormal voltage by the surge generated in the central conductor 1. The capacitance value of the surge protection capacitor is, for example, about 3900 [pF], and when the capacitance value (in this case, for example, 3900 [pF]) of the surge protection capacitor is added to the capacitance value C2 of the earth electrostatic capacitance 12, the cutoff frequency f1 of the high-pass filter 100 becomes about 1 [kHz] according to the above equation (3). In this case, the high-frequency component (of about several [kHz] to 10 [kHz]) transitionally generated at the time of a system trouble or the like attenuates due to an influence of the cutoff frequency f1 of the high-pass filter 100 and cannot be accurately detected. That is, a response of the voltage waveform of the central conductor 1 may not be accurately measured sometimes depending on the capacitance value of the surge protection capacitor.

Because the voltage amplitude of the voltage-divider voltage E2 becomes larger as the frequency becomes higher due to the characteristic of the high-pass filter 100, the high-frequency component of the voltage signal may be saturated with a power supply voltage of the analog circuit 5.

Figure 3:
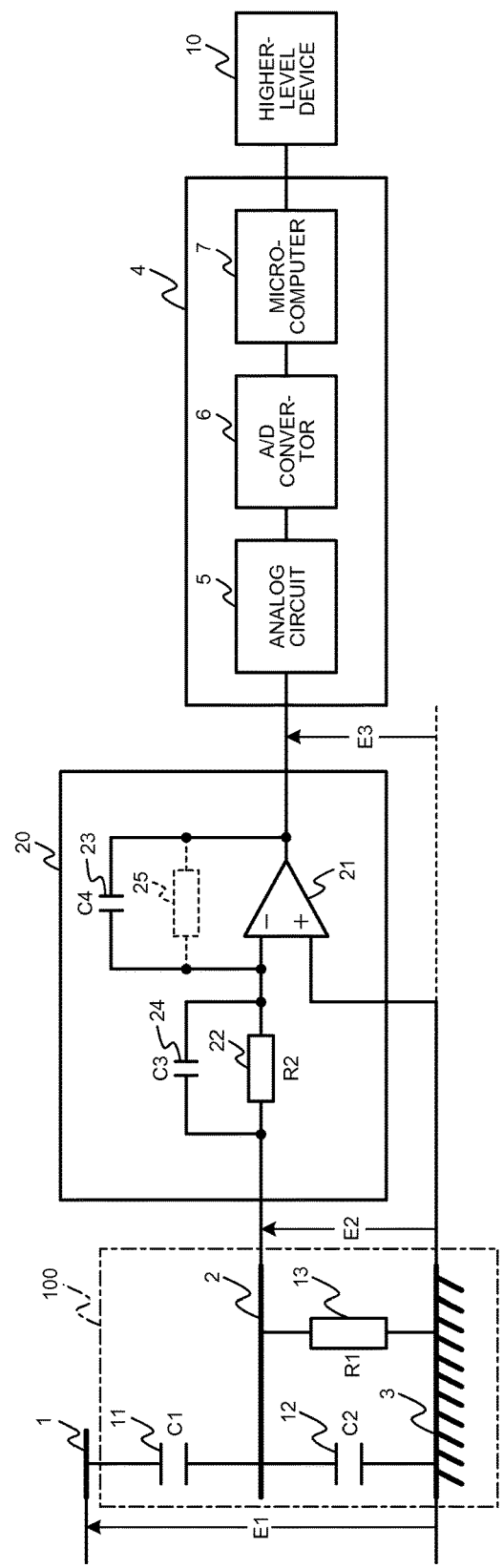
FIG. 3 shows a configuration example of a voltage detection device for a transforming apparatus according to the present embodiment.
Figure 4:
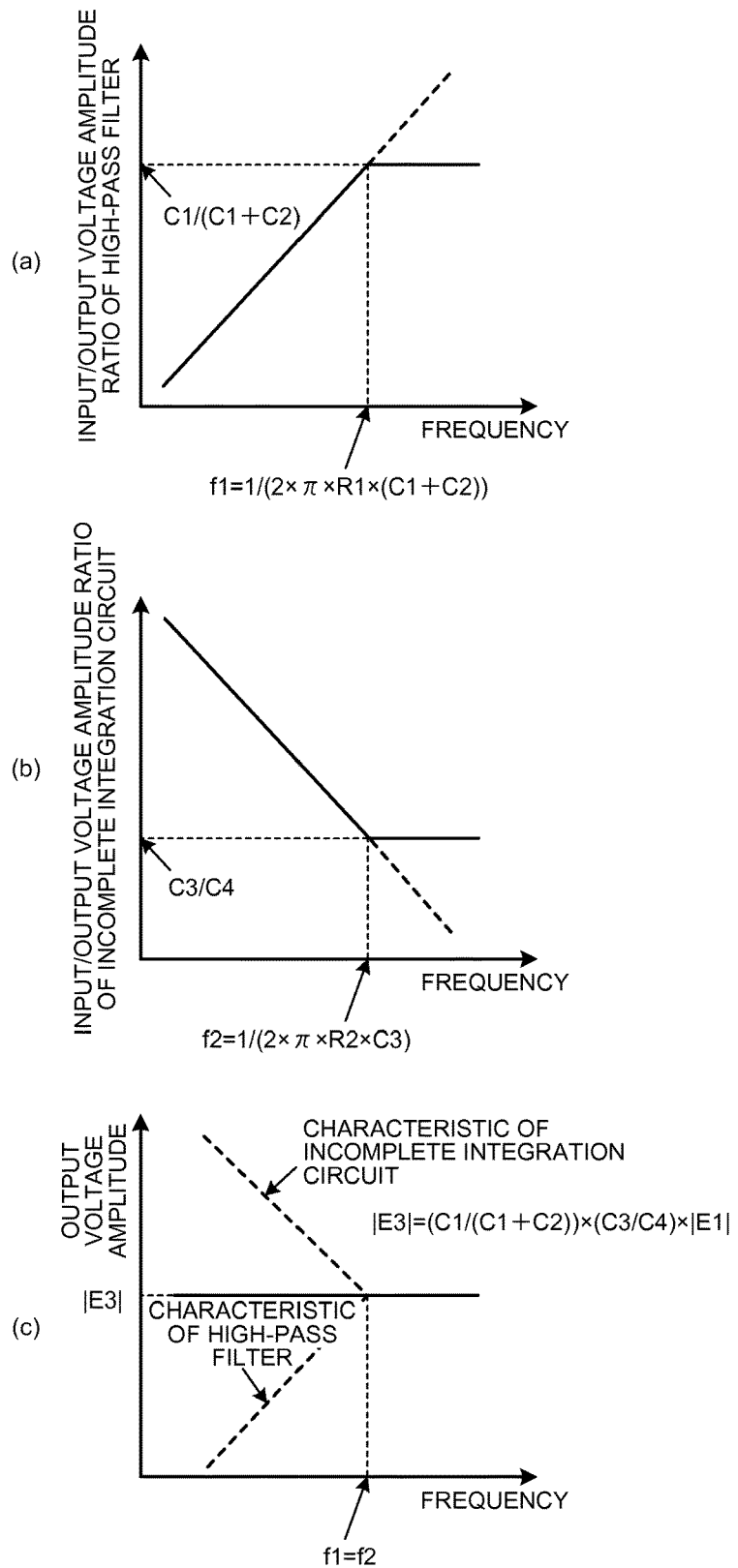
FIG. 4 show characteristic examples of respective units in the voltage detection device for a transforming apparatus according to the present embodiment.

The voltage detection device for a transforming apparatus according to the present embodiment is explained with reference to FIGS. 3 and 4. FIG. 3 shows a configuration example of the voltage detection device for a transforming apparatus according to the present embodiment. FIG. 4 show characteristic examples of respective units in the voltage detection device for a transforming apparatus according to the present embodiment.

In FIG. 4(a), a logarithm of frequency is plotted on a horizontal axis, and an input/output voltage amplitude ratio of the high-pass filter 100 is plotted on a vertical axis. In FIG. 4(b), the logarithm of frequency is plotted on the horizontal axis, and an input/output voltage amplitude ratio of an incomplete integration circuit 20 is plotted on the vertical axis. In FIG. 4(c), the logarithm of frequency is plotted on the horizontal axis, and output voltage amplitude to the signal processing circuit 4 is plotted on the vertical axis.

As shown in FIG. 3, the voltage detection device for a transforming apparatus according to the present embodiment includes the analog incomplete integration circuit (hereinafter, simply "incomplete integration circuit") 20 having a reverse characteristic to an input/output voltage amplitude ratio-frequency characteristic of the high-pass filter 100 at a former stage of the signal processing circuit 4, so that an output voltage amplitude-frequency characteristic to the signal processing circuit 4 (see FIG. 4(c)) becomes flat before and after the cutoff frequency f1 of the high-pass filter 100. In the present embodiment, the complete integration treatment by the microcomputer 7 is not performed.

The incomplete integration circuit 20 is configured to include an operational amplifier 21 with a positive-side input terminal being connected to the tank 3, an input resistor 22 connected to a negative-side input terminal of the operational amplifier 21, a feedback capacitor 23 connected between the negative-side input terminal and an output terminal of the operational amplifier 21, and an input capacitor 24 connected in parallel to the input resistor 22. A saturation protection resistor 25 connected in parallel to the feedback capacitor 23 of the incomplete integration circuit 20 shown in FIG. 3 is provided so that the output voltage of the incomplete integration circuit does not keep an upper limit of the power supply voltage of the circuit. However, the present invention is not limited by the presence of the saturation protection resistor 25.

In a state in which the input capacitor 24 is not present, the incomplete integration circuit 20 becomes a complete integration circuit and has, as shown in FIG. 4(b), such a characteristic that the input/output voltage amplitude ratio monotonously decreases with respect to an increase of the logarithm of frequency, as in the case of the voltage amplitude ratio-frequency characteristic before and after performing the complete integration treatment shown in FIG. 2(b). The incomplete integration circuit 20 is formed by adding the input capacitor 24 to the complete integration circuit, and the input/output voltage amplitude ratio-frequency characteristic of the incomplete integration circuit 20 becomes flat, as indicated by the solid line in FIG. 4(b), in the high-frequency band equal to or higher than a frequency f2. When it is assumed that a resistance value of the input resistor 22 is R2, the capacitance value of the input capacitor 24 is C3, and the capacitance value of the feedback capacitor 23 is C4, an output voltage E3 of the incomplete integration circuit 20 is expressed by the following equation (4) (where ω=2×π× f), and the frequency f2 is expressed by the following equation (5).

$$|E3|=((\sqrt{(1+(\omega \times C3 \times R2)^2)})/\omega \times C4 \times R2)) \times |E2| \quad (4)$$

$$f2=1/(2\times\pi\times R2\times C3) \quad (5)$$

As shown in FIG. 4(c), in order to flatten the output voltage amplitude-frequency characteristic to the signal processing circuit 4, it will be sufficient if it is set to be f1=f2. The following equation (6) can be obtained from the above equations (3) and (5).

$$R1\times(C1+C2)=R2\times C3 \quad (6)$$

By substituting the above equations (2) and (6) into the above equation (4), the output voltage E3 of the incomplete integration circuit 20 is expressed by the following equation (7).

$$|E3|=((C1/(C1+C2))\times(C3/C4))\times|E1| \quad (7)$$

As shown in the above equation (7), the output voltage amplitude-frequency characteristic to the signal processing circuit 4 becomes flat, without depending on the frequency. The output voltage E3 of the incomplete integration circuit 20 output to the signal processing circuit 4 is converted to an analog value proportional to the central conductor voltage E1 in the analog circuit 5, converted to digital data by the A/D convertor 6, and is thereafter output to the higher-level device 10 via the microcomputer 7. Accordingly, the high-frequency component transitionally generated at the time of a system trouble or the like can be accurately detected without being affected by the cutoff frequency f1 of the high-pass filter 100, and a response of the voltage waveform of the central conductor 1 can be accurately measured.

The frequency band in which the output voltage amplitude-frequency characteristic to the signal processing circuit 4 is flat includes at least the rated frequency of the central conductor voltage E1 (for example, 50 Hz) and the cutoff frequency f1 of the high-pass filter 100, and it suffices that the frequency band is a predetermined frequency band that can accurately detect the high-frequency component transitionally generated at the time of a system trouble or the like.

FIG. 5 shows an example of an output characteristic of the incomplete integration circuit in the voltage detection device for a transforming apparatus according to the present embodiment. In the example shown in FIG. 5, the logarithm of frequency is plotted on the horizontal axis, and the output voltage amplitude and a phase are plotted on the vertical axis. In FIG. 5, the solid line indicates the output voltage amplitude-frequency characteristic when the input capacitor 24 is provided, the broken line indicates a phase-frequency characteristic when the input capacitor 24 is provided, the one-dot chain line indicates the output voltage amplitude-frequency characteristic when the input capacitor 24 is not provided, and the two-dot chain line indicates the phase-frequency characteristic when the input capacitor 24 is not provided.

As shown in FIG. 5, when the input capacitor 24 is not provided, that is, when the complete integration circuit is constituted as in the conventional example shown in FIG. 1, a band in which the output voltage amplitude-frequency characteristic is flat becomes narrow, and a band including the high-frequency component transitionally generated at the time of a system trouble or the like (about several [kHz] to 10 [kHz]) attenuates.

On the other hand, when the input capacitor 24 is provided, that is, in the voltage detection device for a transforming apparatus according to the present embodiment, the output voltage amplitude-frequency characteristic becomes flat up to the band including the high-frequency component transitionally generated at the time of a system trouble or the like.

Furthermore, when the input capacitor 24 is provided, that is, in the voltage detection device for a transforming apparatus according to the present embodiment, the band in which the phase-frequency characteristic is flat is enlarged to the high frequency side, as in the case of the output voltage amplitude-frequency characteristic, than in the case of not including the input capacitor 24, that is, in the case of forming the complete integration circuit as in the conventional example shown in FIG. 1.

In this manner, by providing the incomplete integration circuit 20 that includes the input capacitor 24 in parallel to the input resistor (the input resistor 22 shown in FIG. 3) of the complete integration circuit and has the reverse characteristic to the input/output voltage amplitude ratio-frequency characteristic of the high-pass filter 100, the band in which the output voltage amplitude-frequency characteristic and the phase-frequency characteristic become flat can be enlarged to the high frequency side.

Furthermore, by arranging the incomplete integration circuit 20 at a former stage of the signal processing circuit 4, the voltage signal of the high-frequency component is not saturated at the power supply voltage of the analog circuit 5.

The configuration of the present invention can be arranged in such a manner that the voltage dividing resistor 13 and a surge protection capacitor (not shown) to be mounted in parallel to the voltage dividing resistor 13 are provided as constituent elements of the voltage detection device for a transforming apparatus according to the present embodiment, or that the voltage dividing resistor 13 and the surge protection capacitor are mounted outside of the voltage detection device for a transforming apparatus according to the present embodiment. Further, the surge protection capacitor may not be provided.

As explained above, according to the voltage detection device for a transforming apparatus of the present embodiment, the incomplete integration circuit having the reverse characteristic to the input/output voltage amplitude ratio-frequency characteristic of the high-pass filter, which is formed by the floating electrostatic capacitance between the central conductor and the intermediate electrode, the earth electrostatic capacitance between the intermediate electrode and the tank, and the voltage dividing resistor connected in parallel to the earth electrostatic capacitance, is provided at a former stage of the signal processing circuit, so that the output voltage amplitude-frequency characteristic to the signal processing circuit becomes flat before and after the cutoff frequency of the high-pass filter. Accordingly, the high-frequency component transitionally generated at the time of a system trouble or the like can be accurately detected without depending on the cutoff frequency of the high-pass filter, and a response of the voltage waveform of the central conductor can be accurately measured.

Furthermore, by arranging the incomplete integration circuit at a former stage of the signal processing circuit, the voltage signal of the high-frequency component is not saturated at the power supply voltage of the analog circuit.

In the embodiment described above, it has been explained regarding an example in which the output voltage E3 of the incomplete integration circuit is converted to an analog value proportional to the central conductor voltage E1 in the signal processing circuit, and the analog value is converted to digital data to be outputted. However, the configuration can be made in such a manner that the output voltage E3 of the incomplete integration circuit is output to a higher-level device, or that the output voltage E3 of the incomplete integration circuit is converted to an analog value proportional to the central conductor voltage E1 and the analog value is output to the higher-level device.

The configuration described in the above embodiment is only an exemplary structure of the present invention. The configuration can be combined with other well-known techniques, and it is needless to mention that the present invention can be configured while modifying it without departing from the scope of the invention, such as omitting a part of the configuration.

REFERENCE SIGNS LIST 1 central conductor
2 intermediate electrode
3 tank
4 signal processing circuit
5 analog circuit
6 A/D convertor
7 microcomputer
10 higher-level device
11 floating electrostatic capacitance
12 earth electrostatic capacitance
13 voltage dividing resistor
20 analog incomplete integration circuit
21 operational amplifier
22 input resistor
23 feedback capacitor
24 input capacitor
25 saturation protection resistor
100 high-pass filter

The invention claimed is:

1. A voltage detection device for a transforming apparatus in which a voltage divider is constituted by providing an intermediate electrode between a central conductor of the transforming apparatus and a tank, to detect a voltage of the central conductor based on a voltage of the voltage divider, the voltage detection device comprising:
   an incomplete integration circuit having a reverse characteristic to an input/output voltage amplitude ratio-frequency characteristic of a high-pass filter, the high-pass filter formed by a floating electrostatic capacitance between the central conductor and the intermediate electrode, an earth electrostatic capacitance between the intermediate electrode and the tank, and a voltage dividing resistor connected in parallel to the earth electrostatic capacitance; and
   a signal processing circuit that outputs a value based on an output voltage of the incomplete integration circuit as the voltage of the central conductor,
   wherein an output voltage amplitude-frequency characteristic of the incomplete integration circuit becomes linearly decreasing prior to a cutoff frequency of the high-pass filter, and the cutoff frequency of the high-pass filter is set equal to a cutoff frequency of the incomplete integration circuit.

2. The voltage detection device for a transforming apparatus according to claim 1, wherein the signal processing circuit converts the output voltage of the incomplete integration circuit to an analog value proportional to the voltage of the central conductor and outputs the analog value.

3. The voltage detection device for a transforming apparatus according to claim 1, wherein the signal processing circuit converts the output voltage of the incomplete integration circuit to digital data proportional to the voltage of the central conductor and outputs the digital data.

4. The voltage detection device for a transforming apparatus according to claim 1, wherein the incomplete integration circuit has, in a predetermined frequency band including at least a rated frequency of the voltage of the central conductor and the cutoff frequency of the high-pass filter and capable of accurately detecting a high-frequency component transitionally generated at a time of a system trouble, a reverse characteristic to the input/output voltage amplitude ratio-frequency characteristic of the high-pass filter.

5. The voltage detection device for a transforming apparatus according to claim 1, wherein
the incomplete integration circuit is configured to include
an operational amplifier with a positive-side input terminal being connected to the tank,
an input resistor connected to a negative-side input terminal of the operational amplifier,
a feedback capacitor connected between the negative-side input terminal and an output terminal of the operational amplifier, and
an input capacitor connected in parallel to the input resistor.

6. The voltage detection device for a transforming apparatus according to claim 5, wherein $R1 \times (C1+C2) = R2 \times C3$ is satisfied,
wherein C1 is a capacitance value of the floating electrostatic capacitance, C2 is a capacitance value of the earth electrostatic capacitance, R1 is a resistance value of the voltage dividing resistor, R2 is a resistance value of the input resistor, and C3 is a capacitance value of the input capacitor.

7. The voltage detection device for a transforming apparatus according to claim 1, wherein the earth electrostatic capacitance includes a surge protection capacitor that suppresses an abnormal voltage due to a surge generated in the central conductor.

* * * * *